United States Patent
Wang

(10) Patent No.: US 7,999,380 B2
(45) Date of Patent: Aug. 16, 2011

(54) PROCESS FOR MANUFACTURING SUBSTRATE WITH BUMPS AND SUBSTRATE STRUCTURE

(75) Inventor: Chien-Hao Wang, Hsinchu County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 356 days.

(21) Appl. No.: 12/129,996

(22) Filed: May 30, 2008

(65) Prior Publication Data

US 2008/0303146 A1   Dec. 11, 2008

(30) Foreign Application Priority Data

Jun. 7, 2007   (TW) .............................. 96120581 A

(51) Int. Cl.
*H01L 23/52* (2006.01)
*H01L 23/48* (2006.01)
*H01L 29/40* (2006.01)

(52) U.S. Cl. ............... 257/737; 257/E23.021; 257/690; 257/738; 257/779; 438/613; 174/262; 174/263

(58) Field of Classification Search ........... 257/E21.002, 257/E23.021, 690, 738, 774, 778, 779; 438/613; 174/250, 255, 258, 260, 262, 263; 29/846
See application file for complete search history.

(56) References Cited

U.S. PATENT DOCUMENTS

| | | | | |
|---|---|---|---|---|
| 5,909,633 A * | 6/1999 | Haji et al. | ...................... | 438/612 |
| 6,245,490 B1 * | 6/2001 | Yoon et al. | ...................... | 430/318 |
| 6,329,610 B1 * | 12/2001 | Takubo et al. | ................ | 174/264 |
| 6,372,540 B1 * | 4/2002 | Huemoeller | ................... | 438/106 |
| 6,518,089 B2 * | 2/2003 | Coyle | ........................... | 438/106 |
| 6,524,892 B1 * | 2/2003 | Kishimoto et al. | ........... | 438/120 |
| 6,667,546 B2 * | 12/2003 | Huang et al. | .................. | 257/691 |
| 6,828,510 B1 * | 12/2004 | Asai et al. | ...................... | 174/255 |
| 6,915,566 B2 * | 7/2005 | Abbott et al. | ................... | 29/852 |
| 7,105,918 B2 * | 9/2006 | Lee | ............................... | 257/698 |

(Continued)

FOREIGN PATENT DOCUMENTS

CN   1296286   5/2001

(Continued)

OTHER PUBLICATIONS

Chinese First Examination Report of China Application No. 2008100014884, dated Jul. 24, 2009.

(Continued)

*Primary Examiner* — Chris Chu
(74) *Attorney, Agent, or Firm* — J.C. Patents

(57) ABSTRACT

A process for manufacturing a substrate with bumps is provided. First, a metallic substrate having a body and a plurality of conductive elements is provided. Next, a first dielectric layer is formed on the body, and the conductive elements are covered by the first dielectric layer. Then, a plurality of circuits and a plurality of contacts are formed on a surface of the first dielectric layer, and the contacts are electrically connected to the conductive elements. Next, a second dielectric layer is formed on the surface of the first dielectric layer, and the circuits are covered by the second dielectric layer. Finally, the body is patterned to form a plurality of bumps, and the bumps are electrically connected to the contacts by the conductive elements. The bumps are formed by etching the body, so the connection reliability between bumps and conductive elements is desirable, and the manufacturing cost is reduced.

14 Claims, 6 Drawing Sheets

U.S. PATENT DOCUMENTS

| | | | |
|---|---|---|---|
| 7,598,618 B2 * | 10/2009 | Shiraishi | 257/777 |
| 7,755,910 B2 * | 7/2010 | Mashino | 361/765 |
| 2002/0027022 A1 * | 3/2002 | Moriizumi | 174/267 |
| 2003/0146510 A1 * | 8/2003 | Chien | 257/738 |
| 2004/0060174 A1 * | 4/2004 | Imafuji et al. | 29/831 |
| 2004/0212088 A1 * | 10/2004 | Chen et al. | 257/738 |
| 2005/0035464 A1 * | 2/2005 | Ho et al. | 257/778 |
| 2005/0037601 A1 * | 2/2005 | Hsu et al. | 438/612 |
| 2006/0091524 A1 * | 5/2006 | Karashima et al. | 257/700 |

FOREIGN PATENT DOCUMENTS

| | | |
|---|---|---|
| CN | 1921079 | 2/2007 |

OTHER PUBLICATIONS

Chinese Second Examination Report of China Patent Application No. 2008100014884, dated Jan. 29, 2010.

* cited by examiner

PROCESS FOR MANUFACTURING SUBSTRATE WITH BUMPS AND SUBSTRATE STRUCTURE

CROSS-REFERENCE TO RELATED APPLICATION

This application claims the priority benefit of Taiwan application serial no. 96120581, filed on Jun. 7, 2007. The entirety of the above-mentioned patent application is hereby incorporated by reference herein and made a part of this specification.

BACKGROUND OF THE INVENTION

1. Field of the Invention

The present invention relates to a substrate manufacturing process, in particular, to a process for manufacturing a substrate with bumps.

2. Description of Related Art

In addition to a substrate and a chip, a conventional package may further include a transition board or external devices. The substrate is generally designed into a double-sided circuit to meet the functional requirement and to avoid short circuit caused by the small gap between contacts. However, in order to meet the functional requirement and to enlarge the gap between the contacts, the number of layers for the substrate is increased accordingly, and as a result, the thickness of the package cannot be reduced. Moreover, the increased layers in the substrate may increase the probability of short circuits. Furthermore, a conventional substrate is electrically connected to external devices through solder balls. However, the conventional solder ball has a thickness of about 350 μm, and the gap between the solder balls is increased to avoid the short circuit problem. As a result, the substrate cannot meet the high density and fine gap requirements.

SUMMARY OF THE INVENTION

Accordingly, the present invention is directed to a process for manufacturing a substrate with bumps. First, a metallic substrate having a body and a plurality of conductive elements is provided. The conductive elements are formed on a lower surface of the body. Next, a first dielectric layer is formed on the lower surface of the body, and the conductive elements are covered by the first dielectric layer. The first dielectric layer has a first surface and a second surface. Then, a plurality of first circuits and a plurality of contacts are formed on the second surface of the first dielectric layer, and the contacts are electrically connected to the conductive elements. Next, a second dielectric layer is formed on the second surface of the first dielectric layer, and the first circuits are covered by the second dielectric layer. Finally, the body is patterned to form a plurality of bumps, and the bumps are electrically connected to the contacts by the conductive elements. The bumps are formed by etching the body, so the connection reliability between the bumps and the conductive elements are desirable, and the manufacturing cost is reduced.

The present invention is also directed to a substrate structure with bumps. A plurality of second circuits and a plurality of third circuits are formed between the bumps and the conductive elements, and the bumps and the conductive elements are electrically connected by the second circuits and the third circuits.

In the process for manufacturing a substrate with bumps according to the present invention, first, a metallic substrate having a body and a plurality of conductive elements is provided. The body has an upper surface and a lower surface, and the conductive elements are formed on the lower surface of the body. Next, a first dielectric layer is formed on the lower surface of the body, and the conductive elements are covered by the first dielectric layer. The first dielectric layer has a first surface and a second surface. Then, a plurality of first circuits and a plurality of contacts are formed on the second surface of the first dielectric layer, and the contacts are electrically connected to the conductive elements. Next, a second dielectric layer is formed on the second surface of the first dielectric layer, and the first circuits are covered by the second dielectric layer. Finally, the body is patterned to form a plurality of bumps, and the bumps are electrically connected to the contacts by the conductive elements.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
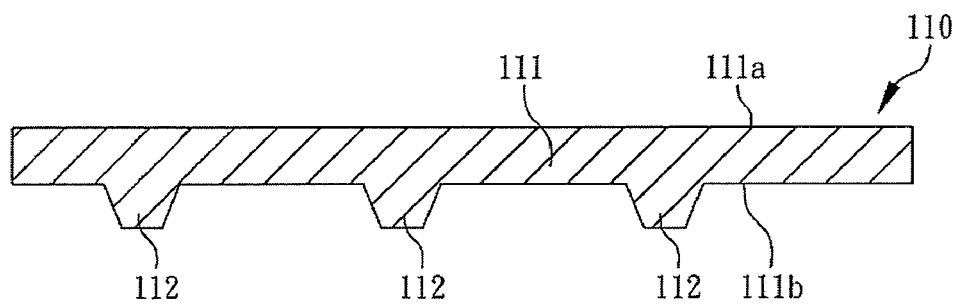
FIGS. 1A to 1G are schematic cross-sectional views of a process for manufacturing a substrate with bumps according to a first embodiment of the present invention.
Figure 1B:
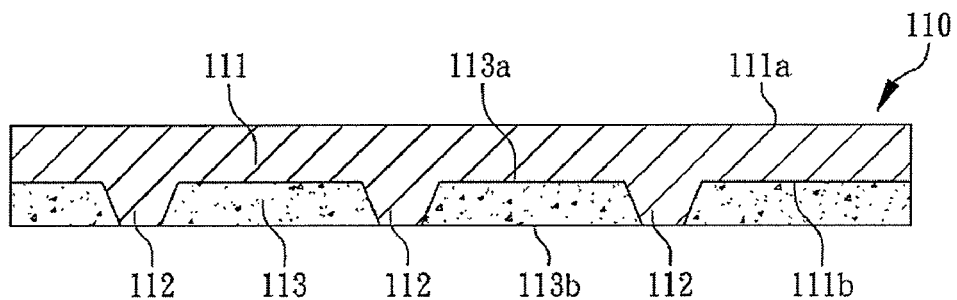
Figure 1C:
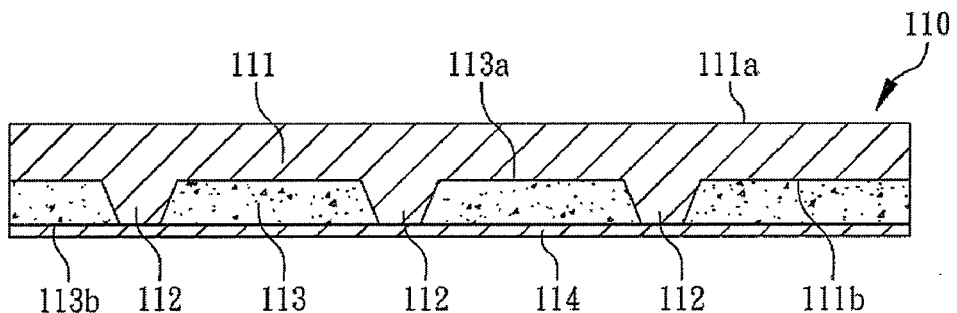
Figure 1D:
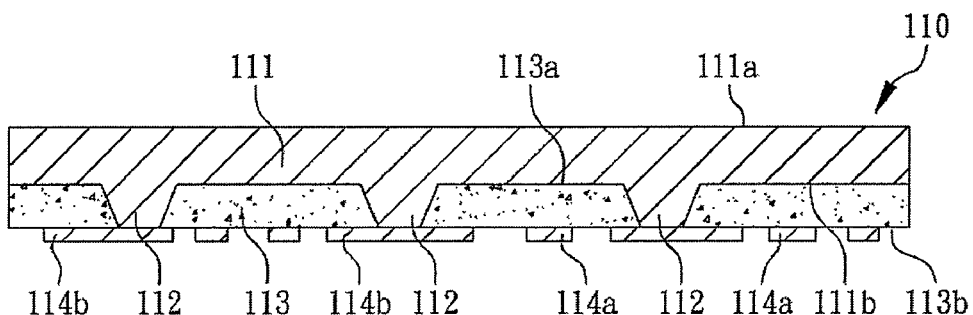
Figure 1E:
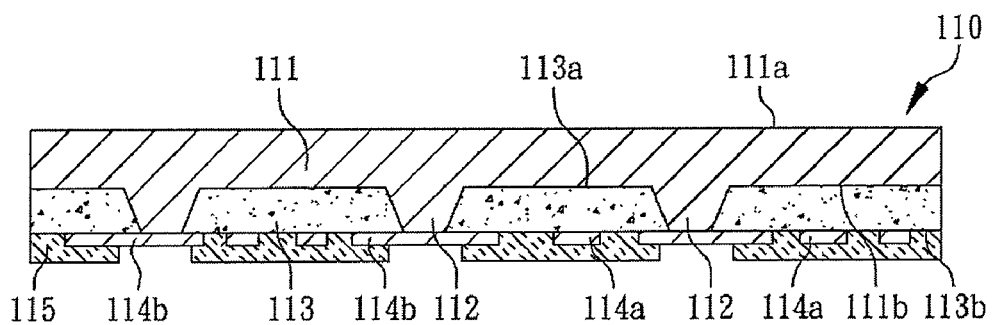
Figure 1F:
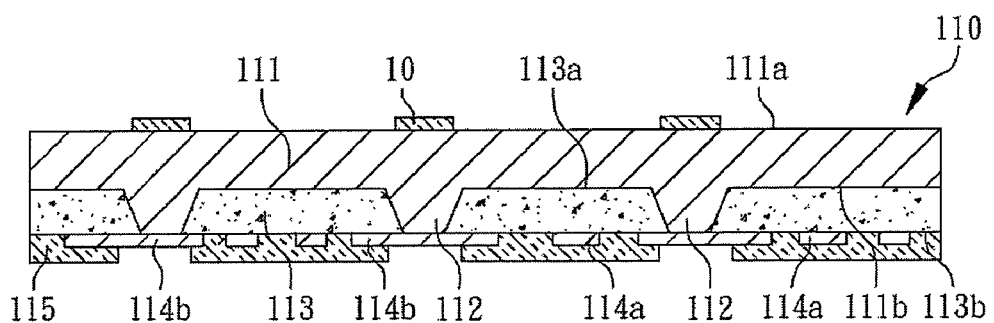
Figure 1G:
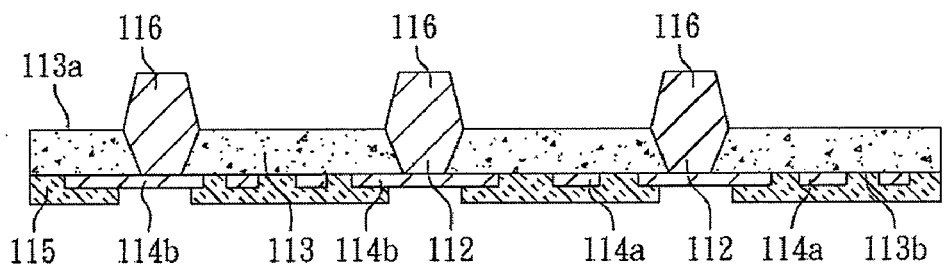

Reference will now be made in detail to the present preferred embodiments of the invention, examples of which are illustrated in the accompanying drawings. Wherever possible, the same reference numbers are used in the drawings and the description to refer to the same or like parts.

Referring to FIGS. 1A to 1G, in a first embodiment of the present invention, a process for manufacturing a substrate with bumps is provided. First, referring to FIG. 1A, a metallic substrate 110 is provided, which is made of Cu, and has a thickness of about 250 μm to 400 μm. The metallic substrate 110 has a body 111 and a plurality of conductive elements 112. The body 111 has an upper surface 111a and a lower surface 111b. The conductive elements 112 are formed on the lower surface 111b of the body 111. In this embodiment, the conductive elements 112 are formed by half-etching the metallic substrate 110, and have a thickness of about 40 μm to 100 μm. Next, referring to FIG. 1B, a first dielectric layer 113 is formed on the lower surface 111b of the body 111, and the conductive elements 112 are covered by the first dielectric layer 113. The first dielectric layer 113 has a first surface 113a and a second surface 113b. The first dielectric layer 113 is made of a reinforced carbon-carbon (RCC) composite material or polypropylene (PP), and has a thickness of about 35 μm. In this embodiment, the first dielectric layer 113 is made of an RCC composite material. Then, referring to FIG. 1C, in this embodiment, a first metallic layer 114 is laminated on the second surface 113b of the first dielectric layer 113. Next, referring to FIG. 1D, the first metallic layer 114 is patterned through, for example, etching, so as to form a plurality of circuits 114a and a plurality of contacts 114b on the second surface 113b of the first dielectric layer 113. The contacts 114b are electrically connected to the conductive elements 112. The first metallic layer 114 is made of Cu, and has a thickness of about 12 μm. Then, referring to FIG. 1E, a second dielectric layer 115 is formed on the second surface 113b of the first dielectric layer 113, and at least covers the circuits 114a. The second dielectric layer 115 may be a solder mask, and has a thickness of about 30 μm. Next, referring to FIG. 1F, a photoresist layer 10 is formed on the upper surface 111a of the body 111. Finally, referring to FIG. 1G, the body 111 is patterned to form a plurality of bumps 116. In this embodiment, the bumps 116 are formed by etching the body 111 to the first dielectric layer 113, and the bumps 116 are electrically connected to the contacts 114b by the conductive elements 112. Thus, a substrate 110' with bumps is formed through the above steps. Furthermore, referring to FIG. 2, a second metallic layer 117 may be formed on the contacts 114b, and may also be formed on the bumps 116. The second metallic layer 117 may be formed through an electroplating process or a non-electroplating process, and used to protect the contacts 114b and the bumps 116. The second metallic layer 117 is made of Ni/Au. The bumps 116 are formed by etching the body 111, so the connection reliability between the bumps 116 and the conductive elements 112 is desirable, and the manufacturing cost is reduced. Moreover, the bumps 116 have a thickness of about 120 μm, and compared with the conventional solder ball with a thickness of 350 μm, the bumps 116 have an advantage of fine gaps.

Figure 3A:
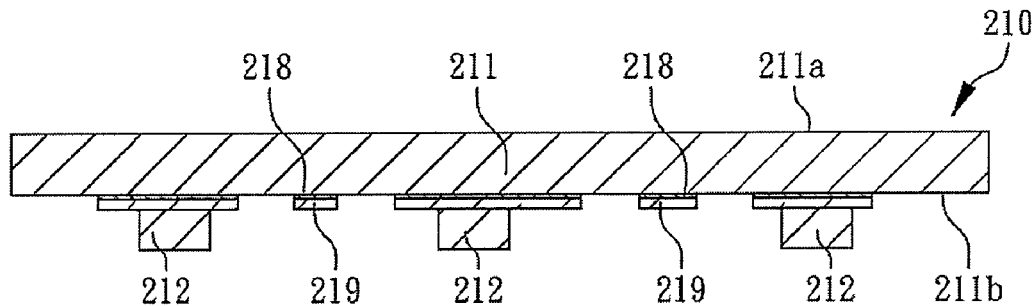
FIGS. 3A to 3G are schematic cross-sectional views of another process for manufacturing a substrate with bumps according to a second embodiment of the present invention.
Figure 3B:
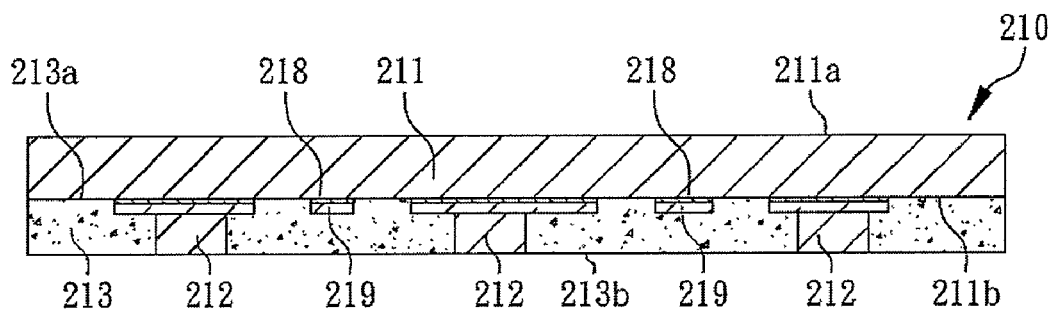
Figure 3C:
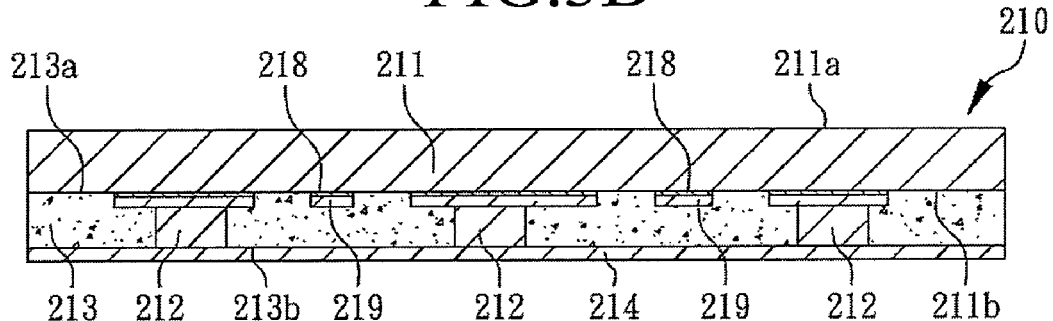
Figure 3D:
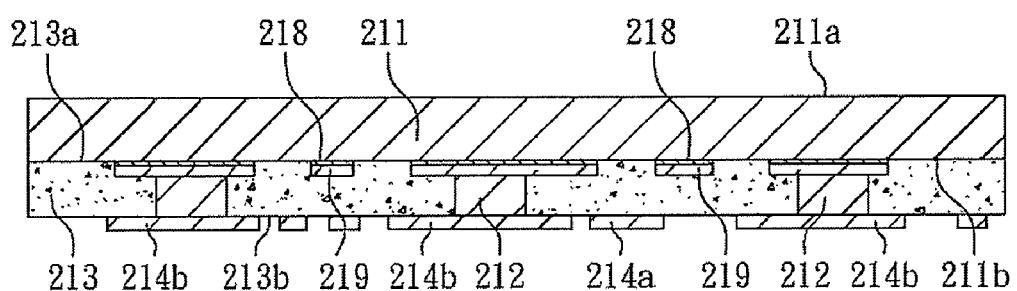
Figure 3E:
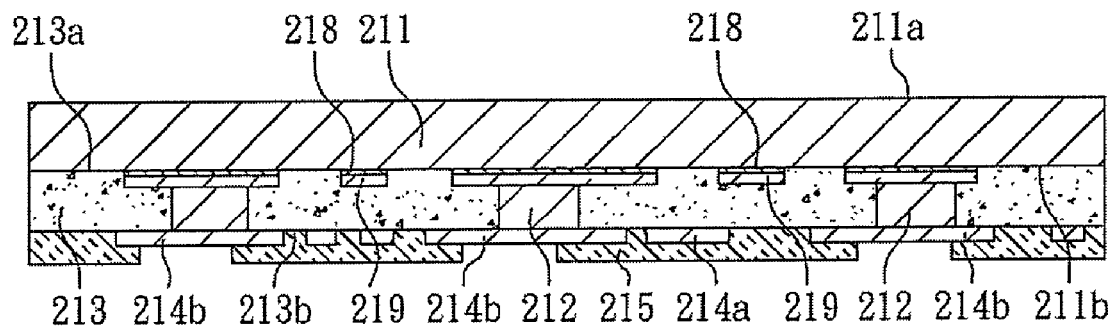
Figure 3F:
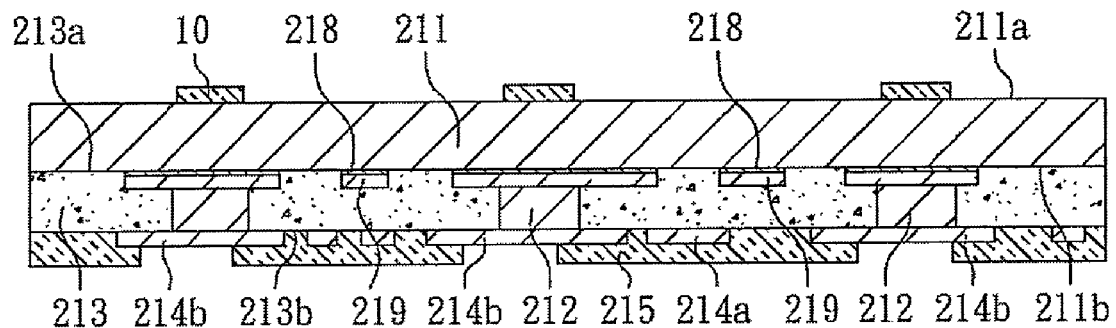
Figure 3G:
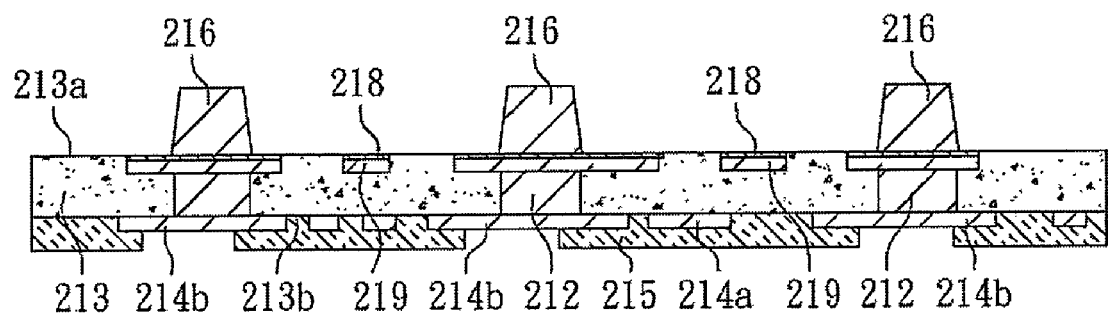
Figure 4A:
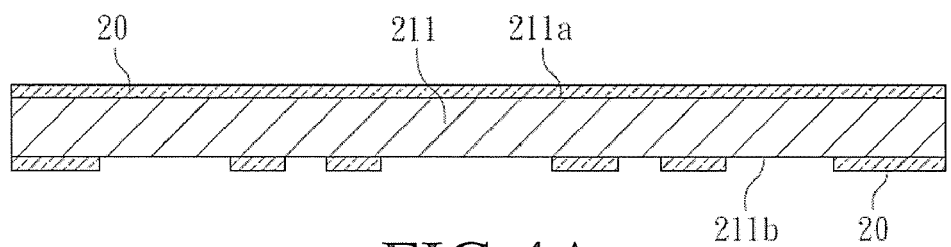
FIGS. 4A to 4E are schematic cross-sectional views of early steps in the process for manufacturing a substrate with bumps according to the second embodiment of the present invention.
Figure 4B:
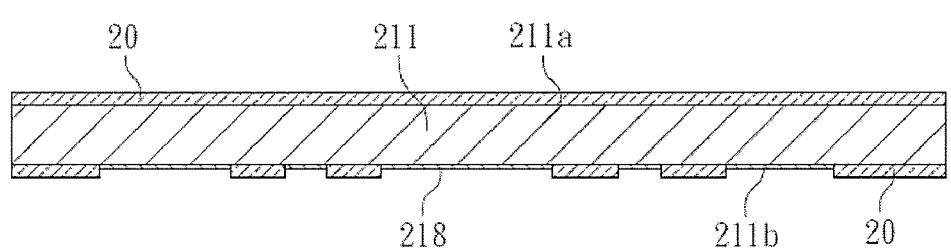
Figure 4C:
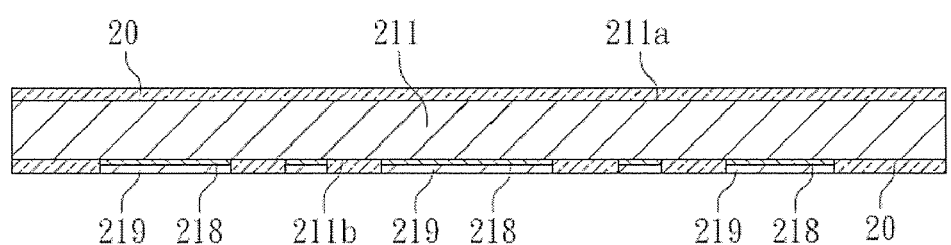
Figure 4D:
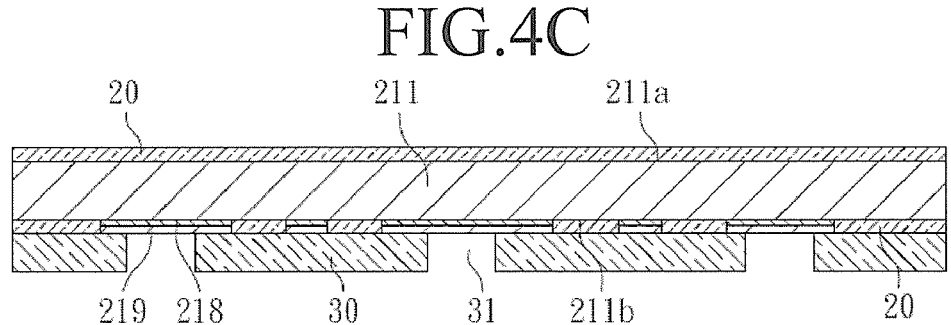
Figure 4E:
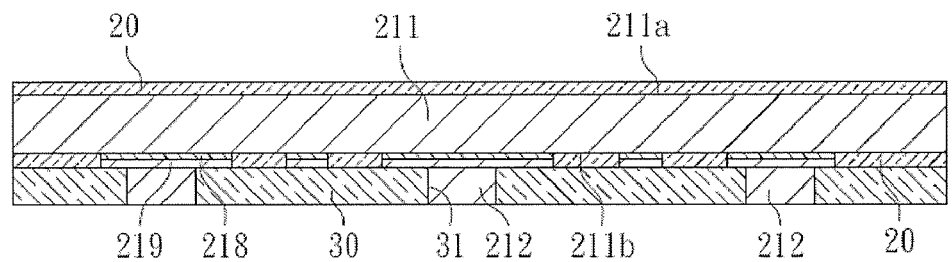

Referring to FIGS. 3A to 3G, in a second embodiment of the present invention, another process for manufacturing a substrate with bumps is provided. First, referring to FIG. 3A, a metallic substrate 210 is provided, which is made of Cu. The metallic substrate 210 has a body 211 and a plurality of conductive elements 212. The body 211 has an upper surface 211a and a lower surface 211b, and has a thickness of about 100 μm to 200 μm. The conductive elements 212 are formed on the lower surface 211b of the body 211. In this embodiment, the conductive elements 212 are formed by electroplating. Before forming the conductive elements 212, the manufacturing process further includes the following steps. Referring to FIG. 4A, a first photoresist layer 20 is formed on the lower surface 211b of the body 211, and the first photoresist layer 20 may also be formed on the upper surface 211a at the same time. In this embodiment, the first photoresist layer 20 on the lower surface 211b has already been patterned. Next, referring to FIG. 4B, with the first photoresist layer 20 taken as a mask, a plurality of second circuits 218 is formed on the lower surface 211b of the body 211 through electroplating, and the second circuits 218 are made of Ni. Then, referring to FIG. 4C, a plurality of third circuits 219 may be formed on the second circuits 218 by electroplating, and the third circuits 219 are made of Cu. Next, referring to FIG. 4D, a second photoresist layer 30 is formed on the first photoresist layer 20, and has a plurality of openings 31 for exposing the third circuits 219. Then, referring to FIG. 4E, the conductive elements 212 are formed within the openings 31 through electroplating. Finally, the first photoresist layer 20 and the second photoresist layer 30 are both removed to form the metallic substrate 210 having the body 211 and the conductive elements 212 as shown in FIG. 3A. In this embodiment, the conductive elements 212 have a thickness of about 30 μm to 50 μm, and the second circuits 218 are formed between the body 211 and the conductive elements 212. The third circuits 219 are formed between the second circuits 218 and the conductive elements 212. Next, referring to FIG. 3B, a first dielectric layer 213 is formed on the lower surface 211b of the body 211, and the conductive elements 212 are covered by the first dielectric layer 213. The first dielectric layer 213 has a first surface 213a and a second surface 213b. In this embodiment, the first dielectric layer 213 is made of an RCC composite material, and has a thickness of about 35 μm. Then, referring to FIG. 3C, in this embodiment, a first metallic layer 214 is laminated on the first dielectric layer 213. Next, referring to FIG. 3D, the first metallic layer 214 is patterned to form a plurality of circuits 214a and a plurality of contacts 214b on the second surface 213b of the first dielectric layer 213. The contacts 214b are electrically connected to the conductive elements 212. The first metallic layer 214 is made of Cu, and has a thickness of about 12 μm. Then, referring to FIG. 3E, a second dielectric layer 215 is formed on the first dielectric layer 213. The second dielectric layer 215 at least covers the circuits 214a. The second dielectric layer 215 may be a solder mask, and has a thickness of about 30 μm. Next, referring to FIG. 3F, a third photoresist layer 10 is formed on the upper surface 211a of the body 211. Finally, referring to FIG. 3G, the body 211 is patterned to form a plurality of bumps 216. In this embodiment, the bumps 216 are formed by etching the body 211 to the first dielectric layer 213, and they are electrically connected to the contacts 214b by the conductive elements 212. Thus, a substrate 210' with bumps is formed through the above steps. Furthermore, referring to FIG. 5, a second metallic layer 217 may be formed on the contacts 214b through an electroplating process or a non-electroplating process. The second metallic layer 217 may also be formed on the bumps 216, and is made of Ni/Au.

Figure 2:
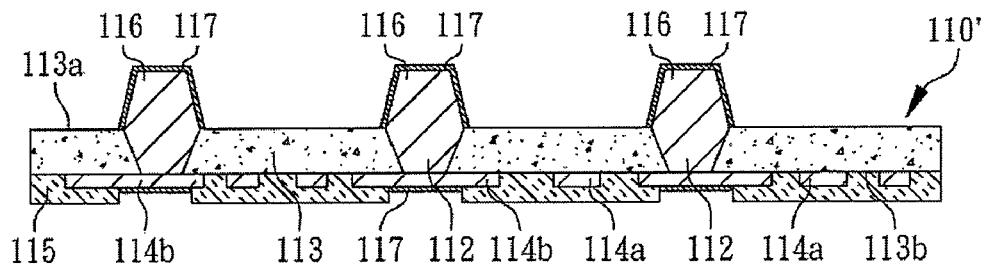
FIG. 2 is a schematic cross-sectional view of a substrate with bumps according to the first embodiment of the present invention.

Referring to FIG. 2, according to the first embodiment of the present invention, a substrate structure 110' with bumps is provided, which includes a plurality of conductive elements 112, a first dielectric layer 113, a plurality of circuits 114a, a plurality of contacts 114b, a second dielectric layer 115, and a plurality of bumps 116. The first dielectric layer 113 has a first surface 113a and a second surface 113b, and it is made of a reinforced carbon-carbon (RCC) composite material or polypropylene (PP). The conductive elements 112 are covered by the first dielectric layer 113. The circuits 114a are formed on the second surface 113b of the first dielectric layer 113. The contacts 114b are formed on the second surface 113b of the first dielectric layer 113 and are electrically connected to the conductive elements 112. The second dielectric layer 115 is formed on the second surface 113b of the first dielectric layer 113. In this embodiment, the second dielectric layer 115 is a solder mask, and the circuits 114a are covered by the second dielectric layer 115. The bumps 116 are formed on the first surface 113a of the first dielectric layer 113 and are electrically connected to the contacts 114b. Preferably, the substrate 110' further includes a metallic layer 117 formed on the bumps 116 and the contacts 114b to protect the bumps 116 and the contacts 114b. The metallic layer 117 is made of Ni/Au.

Figure 5:
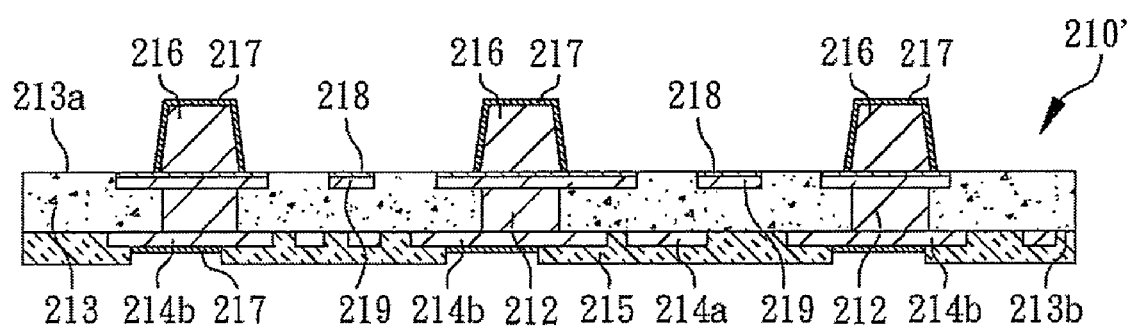
FIG. 5 is a schematic cross-sectional view of another substrate with bumps according to the second embodiment of the present invention.

Referring to FIG. 5, according to the second embodiment of the present invention, another substrate structure 210' with bumps is provided, which includes a plurality of conductive elements 212, a first dielectric layer 213, a plurality of first circuits 214a, a plurality of contacts 214b, a second dielectric layer 215, a plurality of bumps 216, a metallic layer 217, a plurality of second circuits 218, and a plurality of third circuits 219. The first dielectric layer 213 has a first surface 213a and a second surface 213b, and is made of an RCC composite material. The conductive elements 212 are covered by the first dielectric layer 213. The first circuits 214a are formed on the second surface 213b of the first dielectric layer 213. The contacts 214b are formed on the second surface 213b of the first dielectric layer 213 and are electrically connected to the conductive elements 212. The second dielectric layer 215 is formed on the second surface 213b of the first dielectric layer 213 to cover the first circuits 214a. The second dielectric layer 215 is a solder mask. The bumps 216 are formed on the first surface 213a of the first dielectric layer 213 and are electrically connected to the contacts 214b. The metallic layer 217 is formed on the bumps 216 and the contacts 214b. The second circuits 218 are formed between the bumps 216 and the conductive elements 212. The third circuits 219 are formed between the conductive elements 212 and the second circuits 218, and the second circuits 218 and the third circuits 219 are electrically connected to the bumps 216 and the conductive elements 212.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A substrate structure with bumps, comprising:
a plurality of conductive elements;
a first dielectric layer, having a first surface and a second surface opposite to the first surface, wherein the conductive elements are embedded in the first dielectric layer;
a plurality of first circuits, disposed on the second surface of the first dielectric layer;
a plurality of contacts, disposed on the second surface of the first dielectric layer and connected with the conductive elements;
a second dielectric layer, disposed on the second surface of the first dielectric layer, wherein the second dielectric layer covers the first circuits and exposes the contacts;
a plurality of second and third circuits, embedded in the first dielectric layer, wherein the second circuits are disposed on the third circuits, top surfaces of the second circuits are coplanar with the first surface of the first dielectric layer;
a plurality of bumps, disposed on the top surfaces of a portion of the second circuits and electrically connected to the contacts through a number of the second and third circuits disposed between the conductive elements and the bumps, wherein the top surfaces of another portion of the second circuits are exposed and uncovered; and
a metallic layer, disposed on the bumps and disposed on exposed surfaces of the contacts.

2. The substrate structure according to claim 1, wherein the second circuits are made of Ni.

3. The substrate structure according to claim 1, wherein the third circuits are made of Cu.

4. The substrate structure according to claim 1, wherein the first dielectric layer is made of a reinforced carbon-carbon (RCC) composite material or polypropylene (PP).

5. The substrate structure according to claim 4, wherein a thickness of the first dielectric layer is about 35 microns.

6. The substrate structure according to claim 1, wherein the second dielectric layer is a solder mask.

7. The substrate structure according to claim 6, wherein a thickness of the second dielectric layer is about 30 microns.

8. The substrate structure according to claim 1, wherein the metallic layer is a Ni/Au composite layer.

9. The substrate structure according to claim 1, wherein the conductive elements are made of copper.

10. The substrate structure according to claim 9, wherein a thickness of the conductive elements ranges from 30 microns to 50 microns.

11. The substrate structure according to claim 1, wherein the bumps are made of copper.

12. The substrate structure according to claim 11, wherein a height of the bumps ranges from 100 microns to 200 microns.

13. The substrate structure according to claim 1, wherein the first circuits are made of copper.

14. The substrate structure according to claim 13, wherein a thickness of the first circuits is about 12 microns.

* * * * *